United States Patent
Park et al.

(10) Patent No.: US 10,164,128 B2
(45) Date of Patent: Dec. 25, 2018

(54) COMPOSITION FOR SOLAR CELL ELECTRODES AND ELECTRODE FABRICATED USING THE SAME

(71) Applicants: Sang Hee Park, Uiwang-si (KR); Tae Joon Kim, Uiwang-si (KR); Hun Hyu Song, Uiwang-si (KR)

(72) Inventors: Sang Hee Park, Uiwang-si (KR); Tae Joon Kim, Uiwang-si (KR); Hun Hyu Song, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 521 days.

(21) Appl. No.: 14/226,015

(22) Filed: Mar. 26, 2014

(65) Prior Publication Data

US 2014/0290735 A1  Oct. 2, 2014

(30) Foreign Application Priority Data

Mar. 27, 2013  (KR) .................. 10-2013-0033032

(51) Int. Cl.
    *H01L 31/044* (2014.01)
    *H01L 31/0224* (2006.01)

(52) U.S. Cl.
    CPC ...... *H01L 31/022425* (2013.01); *Y02E 10/50* (2013.01)

(58) Field of Classification Search
    CPC ........ H01L 31/00–31/078; Y02E 10/50–10/60
    USPC ................................................ 136/243–265
    See application file for complete search history.

(56) References Cited

U.S. PATENT DOCUMENTS

| | | | | |
|---|---|---|---|---|
| 2,157,933 A | * | 5/1939 | Hensel | H01H 1/023 29/602.1 |
| 5,428,249 A | * | 6/1995 | Sawayama | H01L 31/022425 136/256 |
| 5,800,932 A | * | 9/1998 | Suzuki | H01H 1/023 252/514 |
| 6,150,918 A | * | 11/2000 | Berger | H01C 1/014 338/22 R |
| 2002/0179135 A1 | * | 12/2002 | Shutoh | H01L 35/20 136/200 |
| 2005/0153162 A1 | * | 7/2005 | Takagi | C22C 5/06 428/673 |
| 2008/0230119 A1 | * | 9/2008 | Akimoto | C03C 8/04 136/255 |

(Continued)

FOREIGN PATENT DOCUMENTS

| | | |
|---|---|---|
| CN | 102314955 A | 1/2012 |
| CN | 102779566 A | 11/2012 |

(Continued)

OTHER PUBLICATIONS

Xu, et al., "Observation of Lamellar Structure in a Zn-Rich An-6.3at.% Ag Hyper-Peritectic Alloy Processed by Rapid Solidification" Scripta mater., 44, (2001) pp. 631-636.

(Continued)

*Primary Examiner* — Bach T Dinh
(74) *Attorney, Agent, or Firm* — Lee & Morse, P.C.

(57) ABSTRACT

A composition for solar cell electrodes includes silver powder; a silver alloy (AgX) that includes silver (Ag) and a metal (X), the silver alloy having a eutectic point of about 150° C. to about 900° C.; a glass frit; and an organic vehicle.

12 Claims, 6 Drawing Sheets

(56) References Cited

U.S. PATENT DOCUMENTS

| | | | | |
|---|---|---|---|---|
| 2009/0229665 A1* | 9/2009 | Young | ................ | H01B 1/22 |
| | | | | 136/261 |
| 2009/0267092 A1* | 10/2009 | Fukshima | ............ | H01L 33/20 |
| | | | | 257/98 |
| 2010/0044088 A1* | 2/2010 | Watanabe | ............. | C09J 11/02 |
| | | | | 174/259 |

FOREIGN PATENT DOCUMENTS

| | | |
|---|---|---|
| JP | 3734731 B2 | 1/2006 |
| KR | 10-2011-0052452 A | 5/2011 |
| KR | 10-2012-0078109 A | 7/2012 |

OTHER PUBLICATIONS

Korean Office Action dated Jun. 22, 2015 in Corresponding Korean Patent Application No. 10-2013-0033032.
Korean Office Action dated Feb. 18, 2016.

\* cited by examiner

COMPOSITION FOR SOLAR CELL ELECTRODES AND ELECTRODE FABRICATED USING THE SAME

CROSS-REFERENCE TO RELATED APPLICATION

Korean Patent Application No. 10-2013-0033032 filed on Mar. 27, 2013, in the Korean Intellectual Property Office, and entitled: "Composition for Solar Cell Electrodes and Electrode Fabricated using the Same," is incorporated by reference herein in its entirety.

BACKGROUND

1. Field

Embodiments relate to a composition for solar cell electrodes and electrodes fabricated using the same.

2. Description of the Related Art

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes.

SUMMARY

Embodiments are directed to a composition for solar cell electrodes, the composition including silver powder, a silver alloy (AgX) that includes silver (Ag) and a metal (X), the silver alloy having a eutectic point of about 150° C. to about 900° C., a glass frit, and an organic vehicle.

X may include at least one metal selected from the group of In, Sr, Ce, Zn, Te, Sn, Se, Eu, La, Sb, Pb, Na, Li, Pr, As, and Bi.

The silver alloy may be a powder alloy having an average particle diameter (D50) of about 0.1 μm to about 10 μM.

The silver alloy may be present in an amount of about 0.1 wt % to about 40 wt % based on a total weight of the composition.

The silver alloy may be alloyed in an atomic ratio (Ag:X) of silver (Ag) to the metal X ranging from about 1:99 to about 1:0.03.

When X is Eu or Bi, an atomic ratio of Ag to X may range from about 1:99 to about 1:0.03, when X is Li, Pr, As, Sb, Te, Sr, Ce, or Zn, an atomic ratio of Ag to X may range from about 1:99 to about 1:0.05, when X is La or Pb, an atomic ratio of Ag to X may range from about 1:99 to about 1:0.03, when X is Na, an atomic ratio of Ag to X may range from about 1:99 to about 1:0.08, when X is Sn, an atomic ratio of Ag to X may range from about 1:99 to about 1:0.09, when X is Se, an atomic ratio of Ag to X may range from about 1:99 to about 1:0.11, and, when X is In, an atomic ratio of Ag to X may range from about 1:99 to about 1:0.12.

The composition may include about 55 wt % to about 95 wt % of the silver powder, about 0.1 wt % to 40 wt % of the silver alloy, about 0.5 wt % to about 20 wt % of the glass frit, and about 1 wt % to about 30 wt % of the organic vehicle.

The glass fit may include at least one selected from the group of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide-tellurium oxide-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), and tellurium oxide-zinc oxide ($TeO_2$—$ZnO$) glass fits.

The glass frit may include two types of glass frit having different glass transition points.

The glass frit may have an average particle diameter D50 of about 0.1 μm to about 10 μm.

The composition may further include at least one additive selected from the group of a dispersant, a thixotropic agent, a plasticizer, a viscosity stabilizer, an anti-foaming agent, a pigment, a UV stabilizer, an antioxidant, and a coupling agent.

Embodiments are also directed to a composition for solar cell electrodes, including: unalloyed silver in powder form, one or more binary silver alloys in powder form, the one or more binary silver alloys being represented by the formula AgX, a glass frit, and an organic vehicle, wherein X in the formula AgX is independently In, Sr, Ce, Zn, Te, Sn, Se, Eu, La, Sb, Pb, Na, Li, Pr, As, or Bi.

Embodiments are also directed to a solar cell electrode prepared from a composition according to an embodiment.

BRIEF DESCRIPTION OF DRAWINGS

Features will become apparent to those of skill in the art by describing in detail exemplary embodiments with reference to the attached drawings in which.

DETAILED DESCRIPTION

Figure 1:
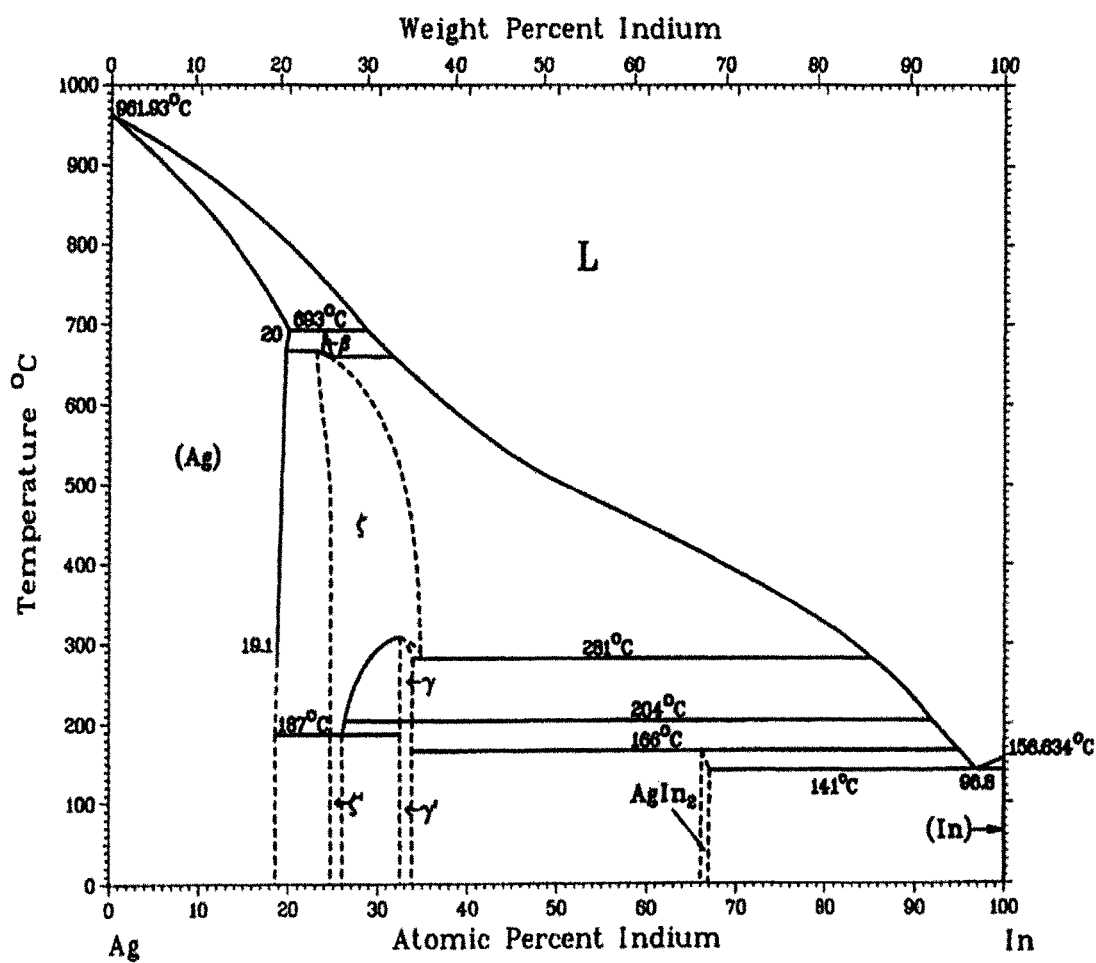
FIG. 1 illustrates a phase diagram of a silver (Ag)-indium (In) alloy.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Composition for Solar Cell Electrodes

A composition for solar cell electrodes according to an example embodiment includes a silver powder, a silver alloy (AgX), a glass frit, and an organic vehicle. According to the present example embodiment, the metal X forms an alloy with silver that exhibits a eutectic point at about 900° C. or less. Thus, the metal X and silver form an alloy melting at a lower temperature than pure silver, which may enhance the utility of the composition for solar cell electrodes.

(A) Silver Powder

The composition for solar cell electrodes according to the invention includes silver (Ag) powder as a conductive powder. The silver powder may be substantially pure silver. The particle size of the silver powder may be on a nanometer or micrometer scale. For example, the silver powder may have a particle size of dozens to several hundred nanometers, or several to dozens of micrometers. In an implementation, the silver powder may be a mixture of two or more types of silver powders having different particle sizes.

The silver powder may have a spherical, flake, or amorphous shape.

The silver powder may have an average particle diameter (D50) of about 0.1 μm to about 10 μm, e.g., about 0.5 μm to about 5 μm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in an amount of about 55 wt % to about 95 wt % based on the total weight of the composition. Within this range, the conductive powder may help prevent deterioration in conversion efficiency due to increase in resistance, and difficulty in forming the paste due to relative reduction in amount of the organic vehicle may be avoided. In an implementation, the silver powder may be present in an amount of about 70 wt % to about 90 wt %.

(B) Silver Alloy (AgX)

The composition for solar cell electrodes according to the present example embodiment includes a silver alloy. The silver alloy is herein denoted by AgX. In the silver alloy AgX, X may form an alloy with silver that exhibits a eutectic point at a temperature of about 150° C. to about 900° C.

The eutectic point refers to the point on the solid phase-liquid phase curves of two components at which the two components are completely melted and mixed with each other in a liquid state without forming a solid solution.

FIGS. 1 to 5 are phase diagrams of mixtures of silver and metal X. In each of the phase diagrams, the x-axis corresponds to an atomic percent or molar ratio of each component and the y-axis corresponds to temperature Celsius.

Figure 2:
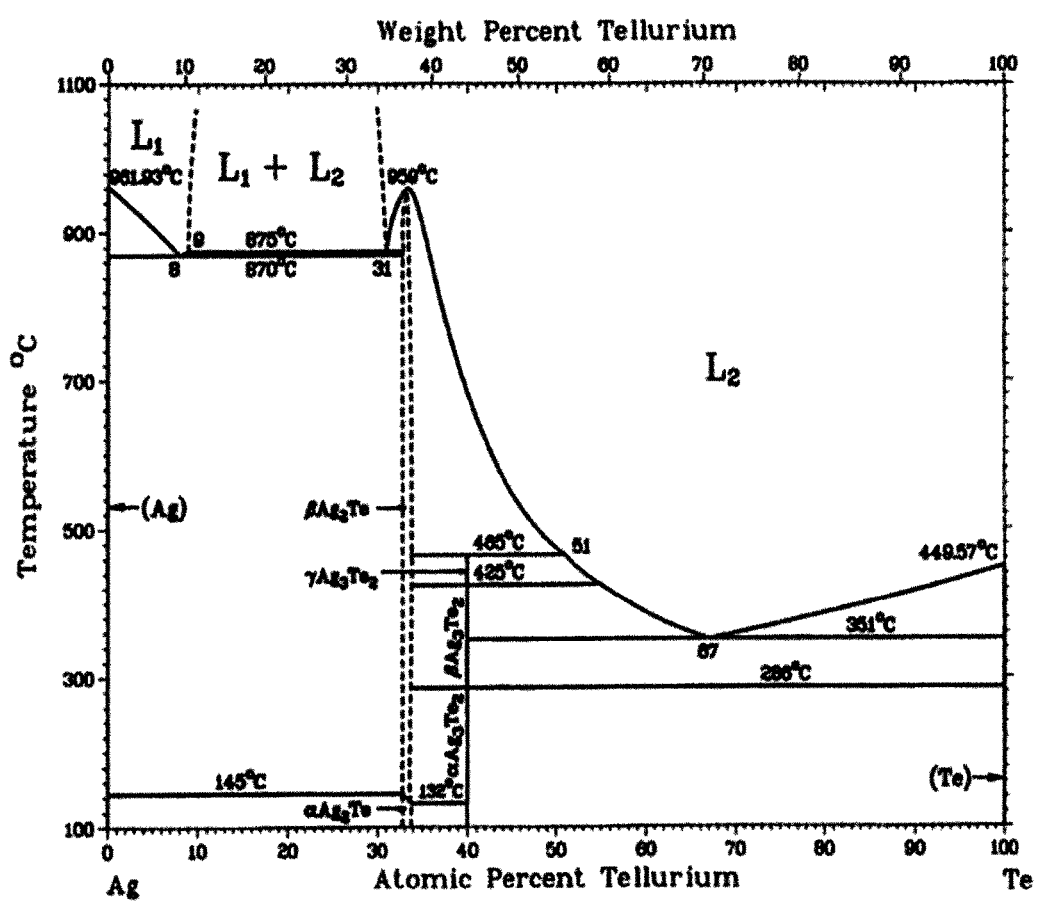
FIG. 2 illustrates a phase diagram of a silver (Ag)-tellurium (Te) alloy.
Figure 3:
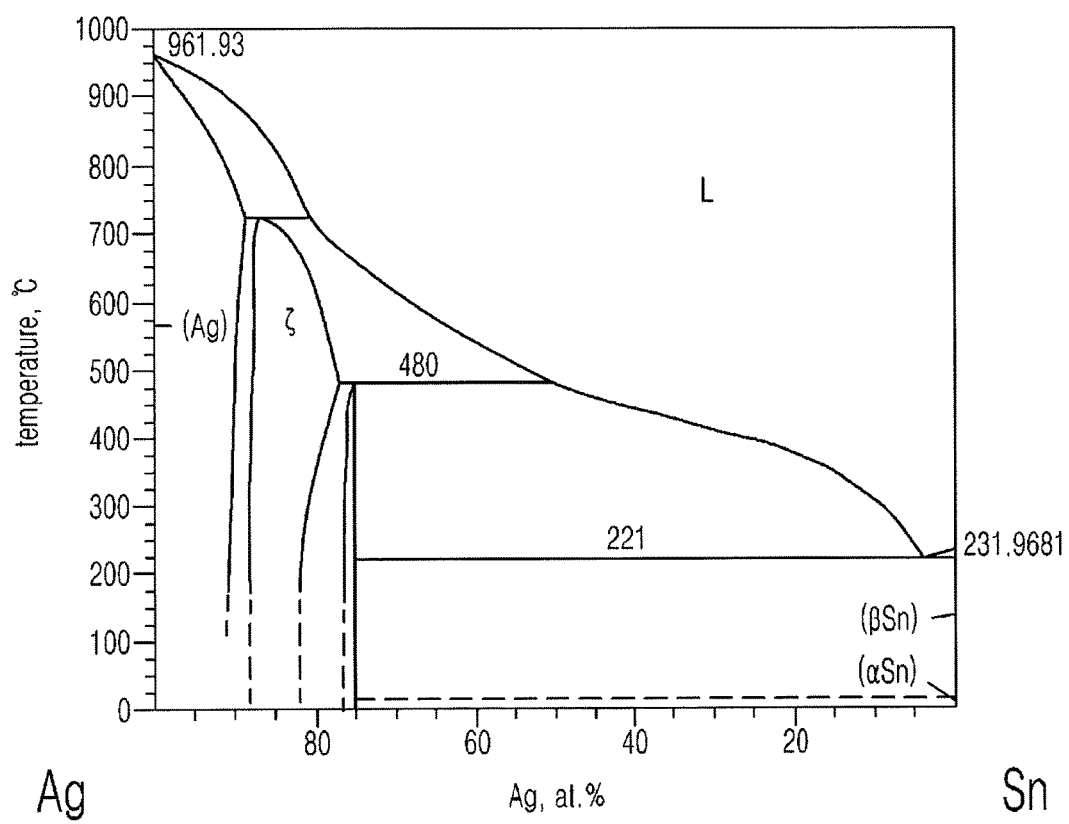
FIG. 3 illustrates a phase diagram of a silver (Ag)-tin (Sn) alloy.

FIG. 1 is a phase diagram of a mixture of silver (Ag) powder and indium (In) forming an alloy with silver (Ag), FIG. 2 is a phase diagram of a mixture of silver (Ag) powder and tellurium (Te) forming an alloy with silver (Ag), and FIG. 3 is a phase diagram of a mixture of silver (Ag) powder and tin (Sn) forming an alloy with silver (Ag).

As may be seen in the phase diagrams in FIGS. 1 to 3, the temperature of the eutectic point is about 156° C. for Ag—In, about 351° C. for Ag—Te, and about 231° C. for Ag—Sn.

Figure 4:
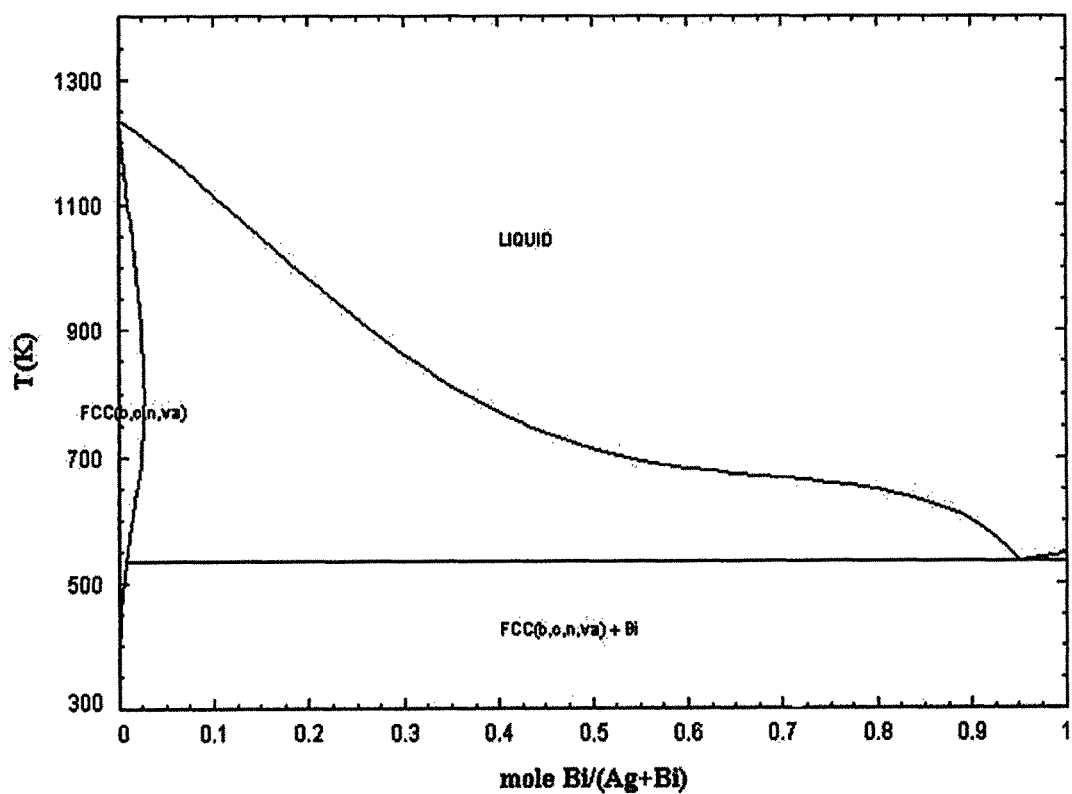
FIG. 4 illustrates a phase diagram of a silver (Ag)-bismuth (Bi) alloy.
Figure 5:
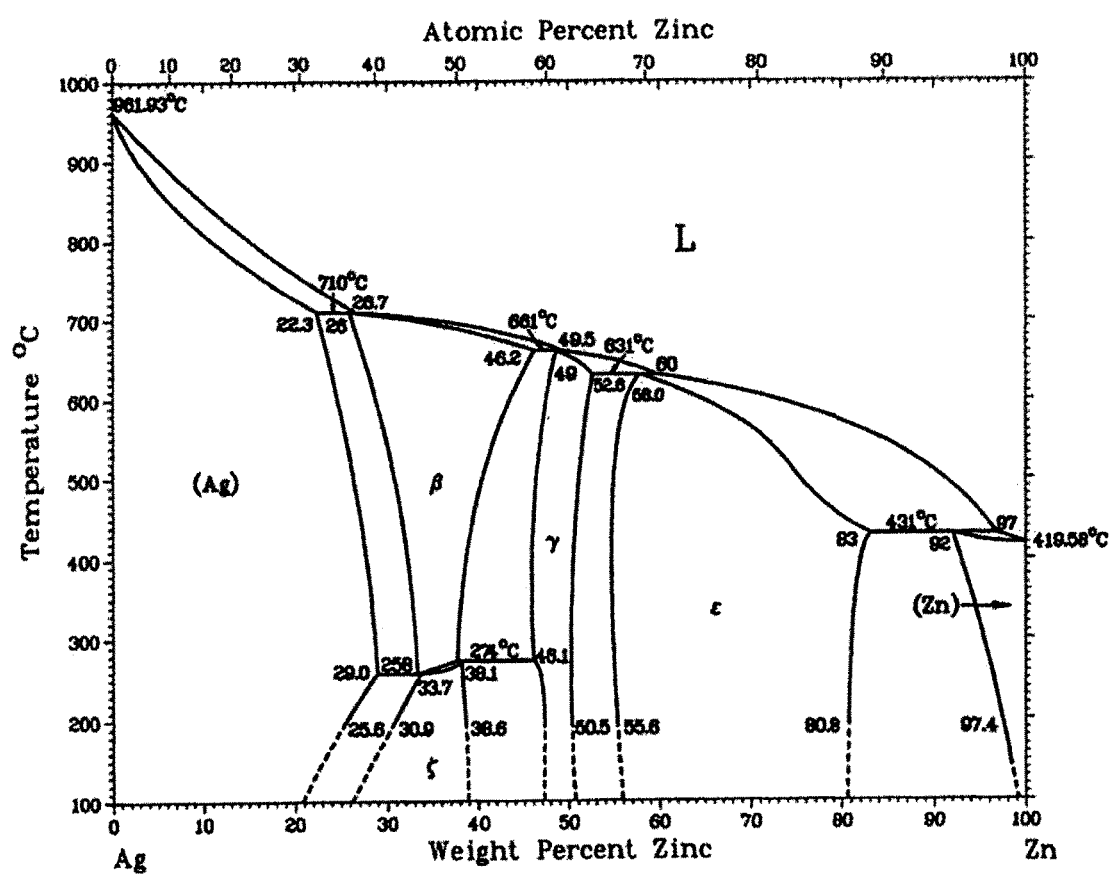
FIG. 5 illustrates a phase diagram of a silver (Ag)-zinc (Zn) alloy.

FIG. 4 is a phase diagram of a mixture of silver (Ag) powder and bismuth (Bi) forming an alloy with silver (Ag).

As may be seen in the phase diagram of FIG. 4, the temperature of the Ag—Bi alloy eutectic point is about 545° C., and at the eutectic point, a molar ratio of Ag to Bi is about 0.05:0.95. That is, when Bi is used as a material alloyed with Ag, the melting point of the Ag-containing Ag—Bi alloy is lower than the temperature of 961.93° C. that is the intrinsic melting point of pure Ag, since the Ag—Bi alloy has a eutectic point of about 545° C. Thus, the present example embodiment may allow electrodes to be manufactured from the silver alloy containing Ag and metal X at a lower temperature than a general process in which Ag is baked at a temperature of 700° C. to 850° C.

The metal X may include at least one metal selected from, e.g., In, Sr, Ce, Zn, Te, Sn, Se, Eu, La, Sb, Pb, Na, Li, Pr, As, and Bi. The metal X may include a suitable metal that forms an alloy with silver that has eutectic point temperature of about 900° C. or less.

Use of the silver alloy AgX in the composition for solar cell electrodes, which composition separately includes Ag as a conductive powder, may avoid oxidation of the metal X before alloying with Ag. In addition, this may provide a lower AgX eutectic point and thus increased sintering rate, which may help minimize serial resistance of the prepared electrodes, and allow liquid phase sintering of silver, thereby providing low contact resistance with the surface of a wafer.

By way of example, the silver alloy may include an Ag—In alloy, Ag—Sr alloy, Ag—Sn alloy, Ag—Bi alloy, Ag—Te alloy, and the like. The silver alloy may be a binary alloy that contains silver and one other element. In an implementation, one or more binary alloys, each in powder form, may be used in the composition. Such silver alloys may provide excellent electromechanical properties and thus may be used for electrodes, e.g., a front electrode.

The silver alloy may be used in the form of powder in order to enlarge a reactive specific surface area. The silver alloy may be a powder alloy having an average particle diameter (D50) of about 0.1 μm to about 10 μm.

In the silver alloy (AgX), when X is europium (Eu) or bismuth (Bi), Ag and X may be alloyed in an atomic ratio of Ag to X ranging from about 1:99 to about 1:0.03. When X is lithium (Li), praseodymium (Pr), arsenic (As), antimony (Sb), tellurium (Te), strontium (Sr), cerium (Ce), or zinc (Zn), Ag and X may be alloyed in an atomic ratio of about 1:99 to about 1:0.05. When X is lanthanum (La) or lead (Pb), Ag and X may be alloyed in an atomic ratio of about 1:99 to about 1:0.03. When X is sodium (Na), Ag and X may be alloyed in an atomic ratio of about 1:99 to about 1:0.08. When X is tin (Sn), Ag and X may be alloyed in an atomic ratio of about 1:99 to about 1:0.09. When X is selenium (Se), Ag and X may be alloyed in an atomic ratio of about 1:99 to about 1:0.11. When X is indium (In), Ag and X may be alloyed in an atomic ratio of about 1:99 to about 1:0.12. Within these ranges, silver (Ag) and metal X may be easily alloyed, which may help enhance conversion efficiency of solar cell electrodes.

The silver alloy may be present in an amount of about 0.1 wt % to about 40 wt %, e.g., about 0.5 wt % to about 25 wt % based on the total weight of the composition. Within this range, it may be possible to provide enhanced conversion efficiency of solar cell electrodes.

(C) Glass Frit

The glass frit may be used to enhance adhesion between the conductive powder and the wafer or the substrate, and to form silver crystal grains in an emitter region by etching an anti-reflection layer and melting the silver powder so as to reduce contact resistance during the baking process of the composition for electrodes. Further, during the baking process, the glass frit may soften and decrease the baking temperature.

When the area of the solar cell is increased in order to improve solar cell efficiency, solar cell contact resistance may increase, which is not desirable. It is desired to minimize both serial resistance (Rs) and influence on the p-n junction. In addition, as the baking temperature may vary within a broad range with increasing use of various wafers having different sheet resistances, it is desirable that the glass frit secure sufficient thermal stability to withstand a wide range of baking temperatures.

The glass frit may be, e.g., a general leaded glass frit, a general lead-free glass frit, a combination thereof, etc.

In an example embodiment, the glass frit may include at least one metal oxide selected from the group of lead oxide, silicon oxide, tellurium oxide, bismuth oxide, zinc oxide, boron oxide, aluminum oxide, tungsten oxide, and combinations thereof. For example, the glass frit may include at least one selected from the group of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$-$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide-tellurium oxide-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), and tellurium oxide-zinc oxide ($TeO_2$—$ZnO$) glass frits.

The glass fit may be prepared from such metal oxides by a general method. For example, the metal oxides may be mixed in a predetermined ratio. Mixing may be carried out using a ball mill or a planetary mill. The mixture may be melted at, e.g., 900° C. to 1300° C., followed by quenching to 25° C. The obtained resultant may be subjected to pulverization using a disk mill, a planetary mill, or the like, thereby preparing a glass frit.

The glass fit may have an average particle diameter (D50) of about 0.1 μm to about 10 μm. The glass fit may have a spherical or amorphous shape. In an example embodiment, a mixture of two types of glass frits having different glass transition temperatures may be used in the composition. For example, a mixture of a first glass fit having a glass transition point ranging from 200° C. to 420° C. and a second glass frit having a glass transition point of higher than 420° C. and 550° C. or less may be used, and the weight ratio of the first glass frit to the second glass fit may range from about 1:0.2 to about 1:1.

The glass fit may be present in an amount of about 0.5 wt % to about 20 wt %, e.g., about 3 wt % to about 15 wt % based on the total weight of the composition. Within this range, it may be possible to obtain excellent ohmic contact.

(D) Organic Vehicle

The organic vehicle may be used to impart suitable viscosity and rheological characteristics for printing to the composition for solar cell electrodes through mechanical mixing with the inorganic component of the composition.

The organic vehicle may be a general organic vehicle, and may include a binder resin, a solvent, and the like.

The binder resin may be selected from, e.g., acrylate resins or cellulose resins. Ethyl cellulose may be generally used as the binder resin. In addition, the binder resin may be selected from among ethyl hydroxyethyl cellulose, nitrocellulose, blends of ethyl cellulose and phenol resins, alkyd, phenol, acrylate ester, xylene, polybutylene, polyester, urea, melamine, vinyl acetate resins, wood rosin, poly(meth) acrylates of alcohols, and the like.

The solvent may be selected from the group of, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations thereof.

The organic vehicle may be present in an amount of about 1 wt % to about 30 wt % based on the total weight of the composition. Within this range, the organic vehicle may provide sufficient adhesive strength and excellent printability to the composition.

(E) Additives

The composition may include additives to enhance flow and process properties and stability. The additives may include, e.g., dispersants, thixotropic agents, plasticizers, viscosity stabilizers, anti-foaming agents, pigments, UV stabilizers, antioxidants, coupling agents, etc. The additives may be used alone or as mixtures thereof. The additives may be present in the composition in an amount of, e.g., about 0.1 wt % to about 5 wt %.

Solar Cell Electrode and Solar Cell Including the Same

Figure 6:
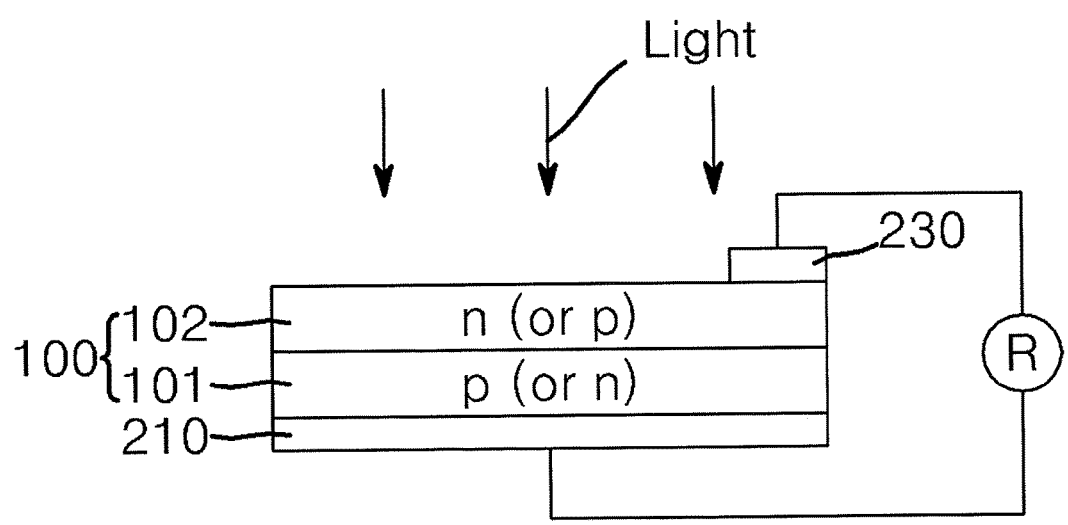
FIG. 6 illustrates a schematic view of a solar cell manufactured using a composition in accordance with an example embodiment.

Another example embodiment is directed to an electrode formed of the composition for solar cell electrodes and a solar cell including the same. FIG. 6 shows a solar cell in accordance with an example embodiment.

Referring to FIG. 6, a rear electrode 210 and a front electrode 230 may be formed by printing and baking the composition according to an embodiment on a wafer or substrate 100 that includes a p-layer (or n-layer) 101 and an n-layer (or p-layer) 102, which will serve as an emitter. For example, a preliminary process of preparing the rear electrode 210 may be performed by printing the composition according to an embodiment on the rear surface of the wafer 100 and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., e.g., at about 850° C. to about 950° C., for about 30 seconds to about 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

As an organic vehicle, 4 wt % of ethyl cellulose (STD4, Dow Chemical Company) was sufficiently dissolved in 7.5 wt % of butyl carbitol at 60° C., and 82 wt % of spherical silver powder (AG-4-8, Dowa Hightech Co., Ltd.) having an average particle diameter of 2.0 μm, 1.0 wt % of silver-indium (Ag—In) alloy powder (Dowa Hightech Co., Ltd.) as a silver alloy having an average particle diameter of 2.0 µm, 4.0 wt % of a low melting point leaded glass frit-1 (leaded glass, CI-1090, Particlogy Co., Ltd.) having an average particle diameter of 1.0 µm and a transition point of 415° C., 1.0 wt % of a low melting point leaded glass frit-2 (leaded glass, CI-5008, Particlogy Co., Ltd.) having an average particle diameter of 1.0 µm and a transition point of 430° C., 0.2 wt % of a dispersant BYK102 (BYK-Chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

The prepared composition was deposited in a predetermined pattern over a front surface of a wafer by screen-printing, followed by drying in an IR drying furnace. Then, a composition for electrodes containing aluminum was printed on a rear side of the wafer and dried in the same manner as above. Cells formed according to this procedure were subjected to baking at 400° C. to 900° C. for 30 seconds to 180 seconds in a belt-type baking furnace, and evaluated as to fill factor (FF, %) and conversion efficiency (%) using a solar cell efficiency tester CT-801 (Pasan Co., Ltd.). The measured fill factor and conversion efficiency are shown in Table 1.

Examples 2 to 6 and Comparative Examples 1 and 2

Compositions for solar cell electrodes were prepared and evaluated as to physical properties in the same manner as in Example 1 except that Ag—Sr, Ag—Sn, Ag—Bi, Ag—Te, Ag—Ce were used as silver alloys in Examples 2 to 6, respectively, and no silver alloy was used in Comparative Example 1, and Ag—Pd was used as a silver alloy in Comparative example 2. Results are shown in Table 1.

TABLE 1

| | | Ex. 1 | Ex. 2 | Ex. 3 | Ex. 4 | Ex. 5 | Ex. 6 | Comp. Ex 1 | Comp. Ex 2 |
|---|---|---|---|---|---|---|---|---|---|
| Silver (Ag) powder (wt %) | | 82 | 82 | 82 | 82 | 82 | 82 | 83 | 83 |
| Glass frit (wt %) | I | 4 | 4 | 4 | 4 | 4 | 4 | 4 | 4 |
| | II | 1 | 1 | 1 | 1 | 1 | 1 | 1 | 1 |
| Silver Alloy (AgX) (wt %) | Ag—In | 1 | 0 | 0 | 0 | 0 | 0 | 0 | 0 |
| | Ag—Sr | 0 | 1 | 0 | 0 | 0 | 0 | 0 | 0 |
| | Ag—Sn | 0 | 0 | 1 | 0 | 0 | 0 | 0 | 0 |
| | Ag—Bi | 0 | 0 | 0 | 1 | 0 | 0 | 0 | 0 |
| | Ag—Te | 0 | 0 | 0 | 0 | 1 | 0 | 0 | 0 |
| | Ag—Ce | 0 | 0 | 0 | 0 | 0 | 1 | 0 | 0 |
| | Ag—Pd | 0 | 0 | 0 | 0 | 0 | 0 | 0 | 1 |
| Organic vehicle (wt %) | Binder | 4 | 4 | 4 | 4 | 4 | 4 | 4 | 4 |
| | Solution | 7.5 | 7.5 | 7.5 | 7.5 | 7.5 | 7.5 | 7.5 | 7.5 |
| Additives (wt %) | | 0.5 | 0.5 | 0.5 | 0.5 | 0.5 | 0.5 | 0.5 | 0.5 |
| Fill Factor (%) | | 77.9 | 77.5 | 77.9 | 77.6 | 77.3 | 77.4 | 73.4 | 72.5 |
| Efficiency (%) | | 17.12 | 16.88 | 17.23 | 16.95 | 16.79 | 16.81 | 14.89 | 14.05 |

As shown in Table 1, it was ascertained that the solar cell electrodes fabricated using the compositions prepared using the metal X forming a silver alloy AgX having a eutectic point of 150° C. to 900° C. in Examples 1 to 6 had low serial resistance and enhanced contact properties, and provided excellent fill factor and conversion efficiency, as compared with those of Comparative Example 1 (in which no silver alloy was used) and Comparative Example 2 (in which Ag—Pd was used as a silver alloy, which did not form a eutectic with a eutectic point less than the melting point of pure silver (about 962° C.).

By way of summation and review, electrodes of a solar cell may be formed on the wafer by applying, patterning, and baking an electrode composition.

Continuous reduction in emitter thickness to improve solar cell efficiency may cause shunting, which may deteriorate solar cell performance. In addition, solar cells have gradually been increased in area to achieve higher efficiency. However, efficiency deterioration due to an increase in solar cell contact resistance is a concern.

Further, with increasing use of wafers having various surface resistances, a temperature range for baking may increase and thus there is an increasing need for a composition for solar cell electrodes capable of securing thermal stability across a wide sintering temperature range.

Therefore, there is a need for a composition for solar cell electrodes capable of securing p-n junction stability while improving solar cell efficiency by minimizing adverse influence on the p-n junction given varying surface resistances.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A composition for solar cell electrodes, the composition comprising:
   silver powder;
   a silver alloy (AgX) that consists essentially of silver (Ag) and a metal (X), and contains the silver (Ag) and the metal (X) in respective amounts such that the silver alloy exhibits a eutectic point of about 150° C. to about 900° C.;

a glass frit; and an organic vehicle, wherein the metal X is In, Sr, Ce, Te, Se, Eu, La, Pb, Na, Pr, As, Bi, or a combination thereof.

2. The composition as claimed in claim 1, wherein the silver alloy is a powder alloy having an average particle diameter (D50) of about 0.1 μm to about 10 μm.

3. The composition as claimed in claim 1, wherein the silver alloy is present in an amount of about 0.1 wt % to about 40 wt % based on a total weight of the composition.

4. The composition as claimed in claim 1, comprising: about 55 wt % to about 95 wt % of the silver powder; about 0.1 wt % to 40 wt % of the silver alloy; about 0.5 wt % to about 20 wt % of the glass fit; and about 1 wt % to about 30 wt % of the organic vehicle.

5. The composition as claimed in claim 1, wherein the glass frit includes at least one selected from the group of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide- boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide-tellurium oxide-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), and tellurium oxide-zinc oxide ($TeO_2$—$ZnO$) glass frits.

6. The composition as claimed in claim 1, wherein the glass frit includes two types of glass frit having different glass transition points.

7. The composition as claimed in claim 1, wherein the glass frit has an average particle diameter D50 of about 0.1 μm to about 10 μm.

8. The composition as claimed in claim 1, further comprising: at least one additive selected from the group of a dispersant, a thixotropic agent, a plasticizer, a viscosity stabilizer, an anti-foaming agent, a pigment, a UV stabilizer, an antioxidant, and a coupling agent.

9. A solar cell electrode prepared from the composition as claimed in claim 1.

10. The composition as claimed in claim 1, wherein the metal X includes at least one metal selected from the group of In, Sr, Ce, Te, and Bi.

11. A composition for solar cell electrodes, comprising: unalloyed silver in powder form; an AgBi binary alloy in powder form; a glass fit; and an organic vehicle, wherein the AgBi binary alloy has a melting point of about 545 ° C. and a molar ratio of Ag to Bi of about 0.05/0.95.

12. A solar cell electrode prepared from the composition as claimed in claim 11.

* * * * *